United States Patent [19]
Tanaka et al.

[11] Patent Number: 6,001,748
[45] Date of Patent: Dec. 14, 1999

[54] SINGLE CRYSTAL OF NITRIDE AND PROCESS FOR PREPARING THE SAME

[75] Inventors: Motoyuki Tanaka, Amagasaki; Kouichi Sogabe, Itami, both of Japan

[73] Assignee: Sumitomo Electric Industries, Ltd., Osaka, Japan

[21] Appl. No.: 08/868,971

[22] Filed: Jun. 4, 1997

[30] Foreign Application Priority Data

Jun. 4, 1996  [JP]  Japan .................................. 8-141236
Apr. 11, 1997  [JP]  Japan .................................. 9-094078

[51] Int. Cl.$^6$ ................................................. H01L 21/31
[52] U.S. Cl. ........................... 438/791; 428/694; 423/111
[58] Field of Search ................................. 438/791, 800; 428/694; 423/111, 351; 51/309; 501/10, 95, 97, 98

[56] References Cited

U.S. PATENT DOCUMENTS 4,919,689  4/1990  Pyzik et al. ................................. 51/309

FOREIGN PATENT DOCUMENTS

| | | |
|---|---|---|
| 02233510 | 9/1990 | European Pat. Off. . |
| 62-51240 | 10/1987 | Japan . |
| 3-53277 | 8/1991 | Japan . |
| 5-12320 | 2/1993 | Japan . |
| 7-277897 | 10/1995 | Japan . |

OTHER PUBLICATIONS

Nishida, K. et al., "Preparation of $Li_3N$ Single Crystal by Floating Zone Technique", Journal of Crystal Growth, vol. 62, 1983, pp. 475–480.

Dryburgh, P.M., "The estimation of maximum growth rate for aluminum nitride crystals grown by direct sublimation", Journal of Crystal Growth 125, 1992, pp. 65–68.

Slack, G.A. et al., "AlN Single Crystals", Journal of Crystal Growth 42, 1977, pp. 560–563.

Slack, Glen A., et al, "Growth of High Purity Ain Crystals," Journal of Crystal Growth, vol. 34, 1976, pp. 263–279.

Grzegory, Izabella, et al, "Synthesis and Crystal Growth of $A^{III}B^V$ Semiconducting Compounds Under High Pressure of Nitrogen," Physica Scripta, vol. T39, pp. 242–249.

Clancy, W.P., "A Limited Crystallographic and Optical Characterization of Alpha and Beta Silicon Nitride," Microscope, vol. 22, 1974, pp. 279–315.

Mishima, O., "Crystal Growth of Cubic Boron Nitride by Temperature Difference Method at ~55kbar and ~1800C," J. Appl. Phys., vol. 61, Apr. 15, 1987, pp. 2822–2825.

Kurai, Satoshi, et al, "Growth of Thick GaN on Sapphire Substrate by Sublimation Method," Department of Electrical and Electronic Engineering, Tokushima University, pp. 45–47.

(List continued on next page.)

Primary Examiner—Charles Bowers
Assistant Examiner—Craig Thompson
Attorney, Agent, or Firm—McDermott, Will & Emery

[57] ABSTRACT

A single crystal of a nitride having a length of not less than 10 mm, a width of not less than 10 mm and a thickness of not less than 300 μm, or having a length of not less than 20 mm and a diameter of not less than 10 μm. In the production of the single crystal, either a mixed powder composed of a nitride powder and an oxide powder or an amorphous nitride powder is provided as a source material powder, the source material powder is heated in a nitrogen atmosphere or in a nitrogen atmosphere containing hydrogen and/or carbon at a temperature below the sublimation temperature or melting temperature of the nitride to decompose and vaporize the nitride powder, and the decomposed and vaporized component is subjected to crystal growth from the vapor phase on a substrate. The nitride single crystal is useful as a bulk material for heat sinks, electric and electronic components, such as semiconductors, optical components, and components of electric equipment and office automation equipment.

23 Claims, 3 Drawing Sheets

OTHER PUBLICATIONS

Inomata, Yoshizo, et al, "Decomposition Temperature of Silicon Nitride in the System of $Si_3N_4$–C–$N_2$(1 atm)," pp. 441–444.

Inomata, Y., et al, "B–$Si_3N_4$ Single Crystals Grown from Si Melts," *Journal of Crystal Growth*, vol. 21, 1974, pp. 317–318.

Niihara, K., et al, "Hot Hardness of CVD–$Si_3N_4$ to 1500C," *Powder Metallurgy International*, vol. 16, No. 5, 1984, pp. 223–226.

Niihara, Koichi, et al, "Growth, Morphology and Slip System of a–$Si_3N_4$ Single Crystal," *Journal of Materials Science*, vol. 14, 1979, pp. 1952–1960.

Kijima, K., et al, "Preparation of Slicon Nitride Single Crystals by Chemical Vapor Deposition," *Journal of Crystal Growth*, Col. 24/25, 1974, pp. 183–187.

Reimanis, Ivar E., et al, "Mechanical Properties of Single–Crystal a–$Si_3N_4$," *Journal of the American Ceramic Society*, vol. 79, No. 8, 1996, pp. 2065–2072.

SINGLE CRYSTAL OF NITRIDE AND PROCESS FOR PREPARING THE SAME

BACKGROUND OF THE INVENTION

1. Field of the Invention

The present invention relates to a single crystal of a nitride for use as heat sinks, electric and electronic components, such as semiconductors, optical components, components of electric equipment and office automation equipment, and other structural components, and a process for preparing the same.

2. Description of the Prior Art

Processes for preparing a single crystal of a nitride include (a) a process wherein high temperature and pressure are applied to a metal to conduct nitriding (a nitriding process), (b) a process which comprises adding a flux component to a metal or a compound thereof, heat-melting the metal or component thereof, and cooling the melt to precipitate a nitride (a flux process), (c) a process wherein a vapor of a compound of a metallic element is transported and reacted to conduct nitriding (a chemical transportation process), (d) a process wherein a metal or a compound thereof is sublimated to deposit a nitride from a vapor phase (a sublimation process), and (e) a process wherein a metallic compound gas is reacted with a gas of nitrogen or a nitrogen compound to deposit a nitride (a chemical vapor deposition process).

For example, "J. of Crystal Growth", Vol. 34, (1976), pp. 263–279 describes mainly about the synthesis of single crystals of AlN, GaN, or InN by the flux process (b), the chemical transportation process (c), and the sublimation process (d). In this literature, however, there is no description to the effect that a single crystal of a nitride having a size useful as electric and electronic components, such as heat sinks, could have been prepared as a bulk.

Japanese Patent Publication No. 5-12320 (1993) describes a process for preparing an AlN single crystal by the flux process (b). Specifically, it describes that an AlN single crystal having a relatively large size, for example, a size of 8 mm square, could be prepared by adding 20 to 70% by weight of an oxide of an alkaline earth metal as a flux to AlN, heat-melting the mixture in a nitrogen or inert gas atmosphere at 1,750 to 2,100° C., and gradually cooling the melt. Further, it describes that further addition of PbO, $Fe_2O_3$, $Li_2O$, $Na_2O$ or the like accelerates the flux effect resulting in the formation of a single crystal having good quality.

Japanese Patent Laid-Open No. 7-277897 (1995) describes a flux process (b) similar to that noted above, wherein an Al alloy (but not AlN) is used as a source and directly nitrided. According to this publication, an Al alloy containing 0.001 to 2% by weight of an alkali metal or an alkaline earth metal can be melted in a nonoxidizing atmosphere at 700 to 1,300° C. to conduct nitriding, thereby preparing an AlN crystal having a size of about 200 to 1,000 $\mu$m.

The above Japanese Patent Laid-Open No. 7-277897 (1995) further describes that, in the process described therein, a pressure in the range of from atmospheric pressure to several tens of thousands of atmospheric pressure is useful in the nonoxidizing atmosphere, the presence of a very small amount of oxygen in the atmosphere is indispensable, and the partial pressure of oxygen is preferably about $10^{-3}$ atm (0.76 Torr). The role of the alkali metal or alkaline earth metal is such that the alkali metal or alkaline earth metal traps oxygen as an impurity in aluminum, and the alkali metal or alkaline earth metal per se goes as a volatile oxide out of the system, facilitating the penetration of nitrogen, which is contained in the atmosphere, into the system instead. Therefore, according to this process, the content of the impurity oxygen in the crystal is considerably lower than that in the case of the process described in Japanese Patent Publication No. 5-12320 (1993) noted above.

In the above process, however, as described in the same publication, the amount of the alkali metal or alkaline earth metal should be regulated to be a low value from the viewpoint of avoiding such an unfavorable phenomenon that the crystal is broken by self-generation of heat due to the direct nitriding of aluminum. As described in the working examples, a long period of time of 50 hr is necessary for the synthesis of a crystal having the above size in a nitrogen atmosphere at atmospheric pressure. Further, the preparation of a crystal having a size of about 600 $\mu$m requires the use of a high pressure of 50,000 atm. Thus, the process described in Japanese Patent Laid-Open No. 7-277897 (1995) has a large problem of production efficiency.

"Physica Scripta.", Vol. T39, (1991), pp. 242–249 describes a process for synthesizing, according to the high pressure process (a), a single crystal of a nitride of a group 3B-5 element, mainly such as GaN, AlN, or InN, at a temperature up to 1,800° C. and a nitrogen pressure up to 15 kb or by pressurization using a piston cylinder pressurizer to a pressure up to 20 kb. This method, however, has problems associated with satisfactory dissolution of nitrogen in the crystal and control of the temperature, and the size of a crystal prepared as a bulk crystal by the synthesis under high pressure nitrogen is not more than 1 mm square. Further, "Microscope", 22, (1974), p. 279 describes that a silicon nitride single crystal having a size of not larger than 55 $\mu$m×0.1 mm×10 mm is synthesized by the high pressure process (a) at a high temperature of 1,800° C. and a high pressure of 15,000 Torr.

"J. Appl. Phys.", Vol. 61, (1987), pp. 2822 2825. describes a process for synthesizing a single crystal of a nitride by a combination of the high pressure process (a) with the flux process (b), that is, by melting and precipitation under high temperature and high pressure conditions. According to this process, BN as a source material is melted through an $LiCaBN_2$ solvent under high temperature and high pressure conditions, that is, about 55 kBar (5,400 atm, $4 \times 10^7$ Torr) and about 1,700° C., and a BN single crystal is precipitated on a seed crystal disposed in a crystal growth section having a temperature below that of the source material section. This precipitation procedure for 30 hr results in the formation of a BN single crystal having a maximum size of 3 mm in width×1 mm in thickness. Since the above process requires high temperature and high pressure, it is difficult to increase the volume of a crystal growth chamber, imposing a limitation on an increase in size of the single crystal grown. Further, a large apparatus is necessary for the generation of high temperature and high pressure, unfavorably increasing the production cost.

Kurai et al. of Tokushima University, Proceedings of Electronic Material Symposium in International Conference held on May, 1995, pp. 45–47 introduces the synthesis of a GaN single crystal on sapphire by the sublimation process (d). According to this literature, a sapphire substrate and a GaN powder as a crystal source are placed within a quartz tube and heated in an ammonia atmosphere at 1,100° C. to grow a GaN single crystal having a thickness of 30 $\mu$m on the substrate.

Japanese Patent Publication No. 3-53277 (1991) also discloses, as an example of the sublimation process (d), a process for epitaxially growing a single crystal having a composition of $(SiC)_x(AlN)_{1-x}$, wherein x is 0.2 to 0.5, on a substrate, which comprises placing $Al_2O_3$ and SiC as crystal sources within a carbon or tungsten crucible, disposing a substrate, such as sapphire, W, or SiC, with a given interval, and heating the crystal source in a mixed gas stream composed of 85% of nitrogen gas and 15% of hydrogen gas to 1,900 to 2,020° C. In this case, hydrogen gas serves to accelerate the growth of the crystal, the gas is flown from the crystal source towards the substrate, and the substrate is kept at a temperature 10 to 100° C. below the temperature of the crystal source. The size of the crystal prepared by this process is described to be about 1 $cm^2$ in area and about 1 to 10 $\mu m$ in thickness.

Japanese Patent Publication No. 62-51240 (1987) describes a process for preparing an SiC single crystal by the sublimation process (d). According to this process, a mixture of 90 to 40% of SiC and 10 to 60% by weight of a silicon material, for example, silica sand, is placed in a graphite crucible, and the mixture is heated to 2,300° C. or below in an inert gas atmosphere at a pressure of 100 to 1,500 mm in terms of water-gauge pressure (754 to 870 Torr) to represent precipitate an SiC single crystal in the crucible. According to the description of this publication, although a plate crystal having a size of 2 to 9 mm square could be prepared, it is difficult to grow a crystal at a gas pressure outside the above range.

"Yogyo-kyokai-shi (Journal of The Ceramic Society of Japan)", 81, (1973), pp. 441–444 describes, as an example of the sublimation process (d), a process wherein the wall of a graphite vessel is coated with an $Si_3N_4$ powder, which has been prepared by nitriding high-purity Si, to form an $Si_3N_4$ layer which is then sublimated at 1,700° C. for 7 hr to prepare an $Si_3N_4$ single crystal on the internal surface of the vessel. The $Si_3N_4$ single crystal prepared by this process is a pale brown, hexagonal columnar single crystal having a length of about 100 $\mu m$ and an outer diameter of about 20 $\mu m$, that is, very small.

Regarding the publications other than described above, "J. of Crystal Growth", 21, (1974), pp. 317–318 describes that high-purity silicon is melted under a nitrogen gas stream of one atm at 1,650° C. for 6 to 12 hr and a $\beta$-$Si_3N_4$ single crystal is synthesized from the melt. The resultant $Si_3N_4$ single crystal is acicular and has a diameter of 0.1 to 0.3 mm and a length of several mm.

"Powder Metallurgy International", Vol. 16, No. 5, pp. 223–226 describes a chemical vapor deposition process (e) wherein a source material gas composed of $SiCl_4$, $NH_3$, and $H_2$ is fed at 50 torr to synthesize a silicon nitride single crystal having a width of 2 mm, a length of 3 mm, and a thickness of 0.5 mm on a graphite heated at 1,500° C. "J. Mater. Sci.," 14, (1979), p. 1952 describes that a single crystal of $\beta$-$Si_3N_4$ having an approximate size of 2×3×0.5 mm is synthesized by a CVD process using a mixed gas of $NH_3$+$SiCl_4$+$H_2$ under a temperature of 1,400 to 1,600° C. and a pressure of 1.5 to 7.5 Torr.

The synthesis of an $Si_3N_4$ single crystal by the chemical vapor deposition process (e) is reported in publications other than described above. For example, "J. of Crystal Growth", 24/25, (1974), pp. 183–187 describes that, by CVD using a mixed gas of $H_2$+$SiCl_4$+$N_2$, a polycrystalline $Si_3N_4$ is deposited at 1,250° C. on a graphite and heated to be grown into a single crystal. According to this process, an $Si_3N_4$ single crystal is synthesized by CVD at 1 atm. The resultant single crystal, however, is small and has an approximate size of several mm in length×0.1 to 0.3 mm in diameter. Further, "J. Am. Ceram. Soc.", 79 (8), (1996), pp. 2065–2073 describes that an $\alpha$-$Si_3N_4$ single crystal, which is several mm in length and diameter, is synthesized by CVD using a mixed gas of $NH_3$+$HSiCl_3$+$H_2$ under a temperature of 1,300 to 1,500° C. and a pressure of 0.5 Torr.

As described above, processes for preparing a single crystal of a nitride include (a) a high pressure process, (b) a flux process, (c) a chemical transportation process, (d) a sublimation process, and (e) a chemical vapor deposition process. The high pressure process (a), however, is disadvantageous in that it is difficult to regulate the content of nitrogen in the crystal, a bulk crystal having a size large enough to be suitable for practical use cannot be prepared and, in addition, the production cost is high. In the case of the flux process (b), a relatively large crystal having an approximate size of 8 mm square can be prepared. In this process, however, a lowering in purity of the crystal caused by a flux, for example, in particular, inclusion of oxygen in the crystal, is unavoidable, and any crystal having good quality capable of meeting property requirements for practical use cannot be prepared. Further, the process, similar to the flux process, described in Japanese Patent Laid-Open No. 7-277897 (1995) can minimize the inclusion of oxygen. As described above, however, the problem of the production efficiency remains unsolved. In the case of the chemical transportation process (c), the source material cost and the production control cost are increased, and, at the same time, the orientation of the resultant crystal is poor. Therefore, crystals prepared by this process have poor suitability for practical use, and crystals usable for practical use are limited to very thin crystals.

The sublimation process (d) can offer a relatively large crystal having good quality. In this process, however, the control of conditions in the crystal growth section is difficult, and, in addition, the sublimation efficiency is low, making it difficult to prepare a large single crystal. Thus, a single crystal of a nitride having a size large enough to be suitable for practical use as a heat sink, an optical component, a semiconductor, a structural material or the like cannot be prepared as a bulk material. The chemical vapor deposition process (e) has a problem of safety because a source material gas having high activity should be handled at a high temperature for a long period of time.

In particular, in the case of the sublimation process (e), use of a large seed crystal as a substrate for growth of a crystal is preferred from the viewpoint of growing a large single crystal. At the present time, however, any large crystal of a nitride usable as a seed crystal cannot be prepared, and other single crystals are used as an alternative. However, there are only a few single crystals utilizable at a high temperature under which a nitride is grown. Even though the single crystal is utilizable, it is, in many cases, difficult to prepare a large single crystal necessary for growing a large single crystal of a nitride. Further, in the conventional sublimation process, since the growth of the crystal is carried out in a high-temperature an atmosphere containing nitrogen, a reaction is likely to occur in a single crystal other than that of a nitride, rendering the crystal unusable as the seed crystal. For example, an attempt to grow aluminum nitride using silicon carbide as a seed crystal results in decomposition of silicon carbide causing sublimation. Thus, in the conventional sublimation process, the temperature is so high that it is difficult to utilize a seed crystal.

SUMMARY OF THE INVENTION

In view of the above situation, an object of the present invention is to solve the above various drawbacks of the conventional processes and to provide a single crystal of a nitride which has good quality and can meet property requirements for practical use and, at the same time, has a size large enough to be suitable for practical use as a bulk material and to a process for simply and efficiently preparing the single crystal of a nitride.

In order to solve the above object, the present invention provides a process for preparing a novel single crystal of a nitride by the sublimation process using a nitride powder as the source material.

The first process comprises the steps of: mixing a nitride powder with an oxide powder which is reactive with the nitride under heating to decompose and vaporize the nitride; heating the mixed powder in a nitrogen atmosphere or in a nitrogen atmosphere containing hydrogen and/or carbon at a temperature below the sublimation temperature or melting temperature of the nitride to decompose and vaporize the nitride powder; and allowing a crystal of the decomposed and vaporized component to grow from a vapor phase on a substrate.

The second process for preparing a single crystal of a nitride according to the present invention comprises the steps of: selecting a powder of an amorphous nitride as a source material nitride powder; heating only the powder of an amorphous nitride in a nitrogen atmosphere or in a nitrogen atmosphere containing hydrogen and/or carbon to decompose and vaporize the nitride powder; and allowing a crystal of the decomposed and vaporized component to grow from a vapor phase on a substrate.

The above processes for preparing a single crystal of a nitride according to the present invention have for the first time enabled the preparation of a single crystal of a nitride having a size large enough to be suitable for practical use as a bulk material. Specifically, it could have become possible to provide a single crystal of a nitride having a length of not less than 10 mm, a width of not less than 10 mm and a thickness of not less than 300 $\mu$m, or having a length of not less than 20 mm and a diameter of not less than 10 $\mu$m.

DETAILED DESCRIPTION OF THE PREFERRED EMBODIMENTS

The size of the single crystal of a nitride according to the present invention is very ;large and has a length of not less than 10 mm, a width of not less than 10 mm and a thickness of not less than 300 $\mu$m, or has a length of not less than 20 mm and a diameter of not less than 10 $\mu$m. The provision of such a large single crystal of a nitride has for the first time enabled the preparation of a large functional material, such as heat sinks, and, at the same time, made it possible to ensure a number of small materials from the large single crystal. The larger the size of the crystal, the smaller the disorder of the orientation of the crystal axis. This makes it possible to provide a functional material which best utilizes the orientation inherent in the crystal and possesses excellent practical properties. When the size of the single crystal is small, these merits cannot be obtained.

The crystallinity of the single crystal of a nitride according to the present invention is preferably such that the half value width of a rocking curve obtained by X-ray diffractometry is not more than 5 min. The single crystal having such good crystallinity has reduced dislocation and defect in the crystal, improving the thermal conductivity, electrical properties, and optical properties. When the half value width of the rocking curve exceeds 5 min, the dislocation or defect in the crystal is increased, making it difficult to stably exhibit excellent properties.

Preferably, the single crystal of a nitride according to the present invention contains a transition metal, specifically titanium or the like, in an amount of 10 ppb to 0.1% by mole. The presence of a very small amount of a transition metal in the single crystal permits the transition metal to combine with oxygen in the single crystal and trap the oxygen, reducing the amount of oxygen homogeneously distributed in the single crystal to reduce the deterioration of properties caused by inclusion of oxygen and improving, for example, the thermal conductivity. When the content of the transition metal is less than 10 ppb, the effect of improving the properties is poor, while when it exceeds 0.1% by mole, undesired materials, such as the transition metal and an oxide and a nitride thereof, to be precipitated in the single crystal, resulting in deteriorated properties.

In the single crystal of a nitride according to the present invention, not less than 90 mol % of a total content of the components other than nitrogen is particularly preferably accounted for by a group 3B element, specifically either at least one member selected from the group consisting of aluminum, gallium, and indium, or silicon. When the content of the group 3B element is less than 90% by mole of the total content of the components other than nitrogen, properties inherent in each nitride, for example, thermal conductivity, insulating properties, and dielectric properties in AlN and luminescence properties and semiconductor properties in GaN, are diluted and, in some cases, lost. When the silicon content is less than 90% by mole of the total content of the components other than nitrogen, properties inherent in silicon nitride, for example, high strength and thermal shock resistance, are diluted and, in some cases, lost. In order to ensure inherent functions based on properties of the nitride or silicon nitride of each group 3B element, not less than 95% by mole of a total content of the components other than nitrogen in the single crystal is still preferably accounted for by the group 3B element or silicon.

In particular, when the single crystal of a nitride is composed mainly of a member selected from the group consisting of $B_kAl_lN$, $B_kGa_mN$, and $B_kAl_lGa_mN$, wherein $0.47 \leq k \leq 0.53$ and $0.47 \leq l+m \leq 0.53$, and has a Wurtzite type crystal structure, excellent functions as heat sinks, blue-ultraviolet fluorescent elements, high-temperature semiconductors, optical components, mechanical components, tools or the like can be expected. In these single crystals, when k is in the range of from 0.47 to 0.53, a Wurtzite type crystal structure is provided. On the other hand, when it is outside the above range, inclusion of a graphite type hexagonal BN occurs, rendering the single crystal unsuitable for the above applications.

The content of oxygen contained in the single crystal of a nitride is preferably not more than 500 ppm, still preferably not more than 300 ppm. The limitation of the oxygen content to the above low level can offer better properties in respect of thermal conductivity, light absorption, and semiconductor properties. On the other hand, when the oxygen content exceeds 500 ppm, the thermal conductivity and the semiconductor properties tend to be deteriorated. In particular, the influence of the energy level of impurity oxygen is likely to appear, often making it impossible to prepare an n-type semiconductor.

The processes for preparing a single crystal of a nitride according to the present invention will be described. In the first process according to the present invention, a mixed powder comprised of a nitride powder and an oxide powder is used as a source material powder. When this mixed powder is heated and vaporized, utilization of a reaction of the nitride with the oxide enables the nitride powder to be decomposed and vaporized at a temperature below the sublimation temperature or melting temperature of the nitride. As described above, the crystal growth of the decomposed and vaporized component in a nitrogen atmosphere from a vapor phase on a substrate results in the synthesis of a large single crystal of a nitride for example, having either a length and a width each of not less than 10 mm and a thickness of not less than 300 $\mu$m, or a length of not less than 20 mm and a diameter of not less than 10 $\mu$m.

According to the second process according of the present invention, a powder of an amorphous nitride as a nitride powder is used as a sole source material powder. In this second process, since the amorphous nitride is more sublimable than a crystalline nitride, high speed sublimation at a low temperature is possible. As described above, the crystal growth of the decomposed and vaporized component in a nitrogen atmosphere from a vapor phase on a substrate permits a large single crystal of a nitride to be efficiently synthesized. In the second process utilizing the powder of an amorphous nitride, the single crystal of a nitride can be grown without mixing any oxide powder. The use of the amorphous nitride powder as the source material powder in the first process can further accelerate the sublimation of the amorphous nitride powder through the oxide powder, permitting a single crystal of a nitride to be more efficiently prepared.

The nitride powder, including an amorphous nitride, as the source material powder is preferably a nitride of a group 3B element, specifically at least one nitride selected from the group consisting of Al, Ga, and In, or a nitride of silicon. These nitride powders may be used either alone or a combination of two or more according to the kind of the contemplated single crystal of a nitride. In particular, AlN and $Si_3N_4$ usually require a high temperature for sublimation. According to the first or second process of the present invention, even these source materials can be sublimated at a low temperature and a high speed, permitting a single crystal to be synthesized more rapidly and efficiently as compared with the prior art process.

The oxide powder used in the first process according to the present invention may be any one so far as it reacts with the nitride under heating to decompose and vaporize the nitride. Such an oxide powder may be composed of either a single oxide or a combination of two or more oxides in the form of oxide powder mixture or composite oxide powder according to the kind of the contemplated single crystal of a nitride. By virtue of the reaction of the nitride with the oxide, when the nitride powder is mixed with the oxide powder followed by heating, the nitride powder can be decomposed at a temperature below the original sublimation temperature or melting temperature (hereinafter referred to as "decomposition temperature") of the nitride, giving a decomposed, vaporized component comprising the metal present, nitrogen, and oxygen. The decomposed, vaporized component permits the crystal of a nitride of the metal present to be grown on a substrate by a vapor phase reaction in a nitrogen atmosphere described below.

Preferred oxides having a function of lowering the decomposition point of the nitride in the first process include oxides of transition metals not vaporizable at the above heating temperature. Among them, oxides of group 4A or 5A elements are preferred. Use of a powder of an oxide of a transition metal element enables the nitride of the group 3B element or silicon to be decomposed and vaporized at a temperature below the decomposition temperature thereof, and the oxide per se is not vaporized at the reaction temperature, realizing the growth of a high-purity single crystal of a nitride. Especially, when oxides of group 4A and 5A elements are used, a single crystal of a nitride having a very low oxygen content can be prepared because the oxides produce new oxides, nitrides, and oxynitrides by the reaction with nitride and these new products do not vaporize at the reaction temperature. In addition, the crystal growth rate can be further accelerated. For these reasons, a titanium oxide powder is particularly preferred as the oxide powder.

A powder of an oxide of a group 3B element may also be used as the oxide powder. As with the oxide of the transition metal element, the oxide of the group 3B element reacts with the nitride of the group 3B element or silicon to give the above decomposed and vaporized component, and, hence, a single crystal of a nitride can be grown from a vapor phase. Use of an oxide of a group 3B element often results in the formation of a vaporized component from the oxide per se during the reaction with the nitride. In this case, however, since the group 3B element is positively supplied to the substrate, the crystal growth rate of the nitride of the group 3B element is accelerated, increasing the growth rate. Further, in this case, advantageously, there is no adverse effect of the resultant single crystal of a nitride on the quality of the crystal.

Regarding the mixing proportion of the oxide powder and the nitride powder, the amount of the oxide powder is preferably 0.01 to 10 mol, still preferably 0.1 to 5 mol, based on one mol of the nitride powder. This mixing proportion can provide a contemplated single crystal of a nitride. In addition, inclusion of oxygen from the oxide into the single crystal of a nitride can be reduced to not more than 500 ppm, and the growth rate of the single crystal of a nitride can be increased. The reason why the above effect can be attained has not been elucidated yet. However, it is considered that the above mixing proportion can prevent the vaporization of the oxide per se, inclusion of oxygen and impurity metal into the single crystal of a nitride can be inhibited, and, further, the rate of production of the decomposed, vaporized component by a reaction of the oxide with the nitride is increased.

In the first and second processes, heating of the source material powder, that is, heating of the mixed powder composed of a nitride powder and an oxide powder or an amorphous nitride is conducted in a nitrogen atmosphere. In this case, a nitrogen atmosphere containing hydrogen and/or carbon may also be used. As described above, the above source material powder, when merely heated at a temperature below the sublimation temperature or the melting temperature of the nitride, permits the nitride powder to react with the oxide powder and consequently to be decomposed and vaporized or alternatively the amorphous nitride powder to be solely decomposed and vaporized, and the decomposed and vaporized component is subjected to crystal growth as a nitride on a substrate in the above atmosphere by a vapor phase reaction. Further, since the amount of oxygen included is reduced to a low level, it is possible to prepare a single crystal of a nitride having excellent quality and good properties.

Bringing the partial pressure of oxygen in the atmosphere around the substrate to not more than $10^{-2}$ Torr can reduce the amount of oxygen included into the single crystal to not more than 300 ppm, offering a better single crystal of a nitride. Further, regulation of the atmosphere around the substrate to bring the ratio of the partial pressure Pr of hydrogen and carbon to the partial pressure Po of oxygen and an oxide other than hydrogen and carbon, Pr/Po, to 1 to $10^6$ results in the formation of a high-quality single crystal of a nitride which has a content of included oxygen of not more than 200 ppm and reduced inclusion of carbon and hydrogen. When the Pr/Po ratio is less than 1, the effect of inhibiting the inclusion of oxygen is often deteriorated, while when it exceeds $10^6$, the inclusion of carbon and hydrogen into the crystal is unavoidable.

As described above, in the present invention, the nitride can be decomposed and vaporized at a temperature below that used in the prior art. Therefore, the substrate for growing the single crystal of a nitride may be any one so far as the material constituting the substrate can withstand the decomposition and vaporization temperature. Specific examples of substrates usable herein include single crystal substrates of sapphire and silicon carbide. In particular, for these substrates, a larger size is available as compared with that in the case of a nitride substrate, rendering these substrates useful for the preparation of a large single crystal of a nitride.

EXAMPLE 1

An AlN single crystal was synthesized using an AlN powder and an oxide powder as source material powders by the following sublimation method. Specifically, 8.0 g of a powder of $TiO_2$ having a purity of 99% was added to 20.5 g of a powder of AlN having a purity of 99% (molar ratio of $TiO_2$ to AlN=0.2:1), and 9 g of phenol as a source of a carbon atmosphere was added thereto (molar ratio of phenol to AlN=1.0:1.0), followed by ultrasonic mixing in ethanol. The mixture was then dried to remove ethanol, thereby preparing a mixed powder which was then compression-molded. Separately, a c-face-cut, 6H type SiC single crystal plate having a size of 10 mm square was provided as a substrate for crystal growth.

Figure 1:
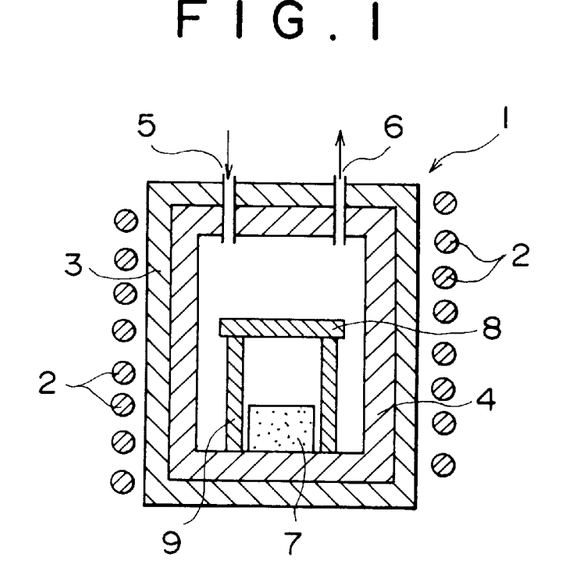
FIG. 1 is a cross-sectional view showing a heating furnace used in Example 1.

A source material powder composed of the mixed powder and the substrate were placed in a heating furnace as shown in FIG. 1. Specifically, the heating furnace 1 is provided with an induction heating coil 2 and a heat insulator muffle 3, and a vessel-like Mo crucible 4 with a lid is provided within the heat insulator muffle 3. An inlet 5 and an outlet 6 for an atmosphere gas are provided at the top of the heating furnace 1. The compression-molded source material powder 7 was placed within the Mo crucible 4 in the heating furnace 1, and the substrate 8 constituted of an SiC single crystal plate was supported by a plate 9 made of an AlN sintered body and set above and so as to face the source material powder 7.

The interior of the heating furnace 1 was once evacuated. Thereafter, a nitrogen gas was introduced through the inlet 5 into the furnace 1 to bring the pressure within the furnace 1 to 1 atm (760 Torr). Then, the outer portion of the mixed powder 7 in the Mo crucible 4 was heated to 1,800° C. (decomposition temperature of AlN: 2,200° C.) by means of the induction heating coil 2, and, at the same time, the outer surface of the substrate 8 was heated to 1,700° C. by regulating the heating section. The system was held in this state for 24 hr. In this case, components in the vapor phase within the Mo crucible 4 were then analyzed by spectroscopy. As a result, the partial pressure of oxygen was 0.005 Torr with the ratio of the partial pressure of carbon (Pr) to the partial pressure of oxygen (Po), Pr/Po, being 2.

After the reaction for 24 hr, it was found that a transparent amber-colored mass having a size of 10 mm square and a thickness of 7,100 µm was grown on the lower surface of the substrate 8 constructed of an SiC single crystal plate having a size of 10 mm square. The mass was then analyzed for the crystal structure by X ray diffractometry. As a result, it was confirmed that the crystal structure was in agreement with that of aluminum nitride and the crystal was single crystal. Further, the composition of the crystal was analyzed. As a result, it was found that 92 mol % of the components excluding nitrogen was accounted for by aluminum, a group 3B element, the oxygen content was 460 ppm, the carbon content was 8 mol %, and the titanium content was 0.06 mol %. A rocking curve of an aluminum nitride (0002) face of this crystal was obtained according to a four crystal method utilizing a gallium (110) face by means of CuKα line. As a result, the half value width was found to be 36 sec.

EXAMPLE 2

In the same manner as in Example 1, an aluminum nitride single crystal was synthesized using the same AlN powder and $TiO_2$ powder as those used in Example 1, and a substrate constructed of an SiC single crystal plate having the same material and size as those of the substrate used in Example 1, except that the molar ratio of the $TiO_2$ powder to the AlN powder, in the same amount as that used in Example 1, i.e., $TiO_2$/AlN, was varied as specified in the following Table 1, and these powders were mixed together in ethanol without adding phenol as the source of a carbon atmosphere to prepare mixtures which were then dried to prepare source material powders. Further, each powder of $ZrO_2$, $V_2O_5$, and $Cr_2O_3$ was provided instead of the $TiO_2$ powder and mixed with the AlN powder in the same manner as described just above to prepare source material powders.

Figure 2:
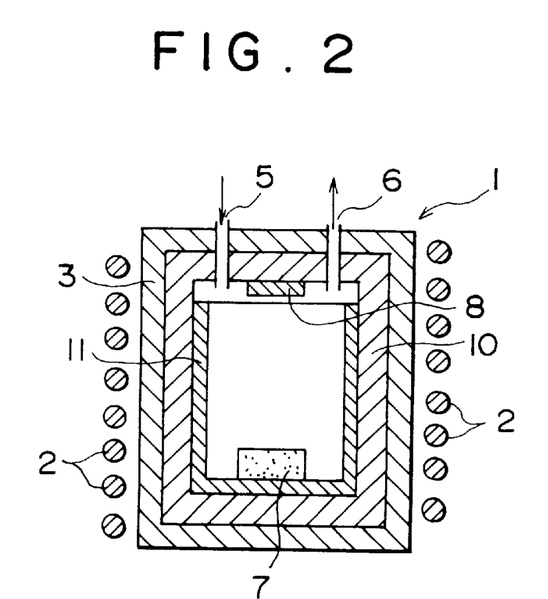
FIG. 2 is a schematic cross-sectional view showing a heating furnace used in Examples 2, 6, 9, 11, 12, and 13.

The construction of a heating furnace 1 used was fundamentally the same as that used in Example 1. In the furnace 1 used in this example, however, a vessel-like graphite crucible 10 with a lid was placed on the inside of the heat insulator muffle 3 as shown in FIG. 2, and a BN crucible 11 without a lid was set on the inside of the graphite crucible 10. Each of the source material powder 7 was placed in the BN crucible 11, and the SiC single crystal plate as the substrate 8 was placed on the inner surface of the lid of the graphite crucible 10 so that it was located above and so as to face the source material powder 7. In this state, an aluminum nitride single crystal was grown in the same manner as in Example 1. For comparison, an aluminum nitride single crystal was grown in the same manner described just above, except that the source material powder 7 was heated to 2,300° C., that is, a temperature not lower than the decomposition temperature of aluminum nitride and the temperature around the substrate 8 was set at 2,100° C.

Conditions for growing a single crystal for each sample are summarized in Table 1, and the size and the chemical composition of the resultant single crystals of aluminum nitride are summarized in Table 2. For reference, the data in Example 1 are also summarized as the sample 1 in Table 1. The partial pressure (Pr) of carbon for samples 2 to 9 in Example 2 given in Table 1 is derived from the graphite crucible 10.

TABLE 1

| Sample | Oxide | Molar ratio (to AlN) | Atmosphere (Torr) | Heating temperature (° C.) | Partial pressure of $O_2$ (Torr) | Pr/Po Partial pressure ratio | Substrate temperature (° C.) |
|---|---|---|---|---|---|---|---|
| 1 | $TiO_2$ | 0.2 | $N_2$(760) | 1800 | 0.005 | 2.0 | 1700 |
| 2 | $TiO_2$ | 0.005 | $N_2$(760) | 1800 | 0.05 | 2.0 | 1700 |
| 3 | $TiO_2$ | 0.75 | $N_2$(760) | 1800 | 0.05 | 2.0 | 1700 |
| 4 | $TiO_2$ | 5.0 | $N_2$(760) | 1800 | 0.05 | 2.0 | 1700 |
| 5 | $TiO_2$ | 12.0 | $N_2$(760) | 1800 | 0.05 | 2.0 | 1700 |
| 6 | $ZrO_2$ | 0.2 | $N_2$(760) | 1800 | 0.05 | 2.0 | 1700 |
| 7 | $V_2O_5$ | 0.2 | $N_2$(760) | 1800 | 0.05 | 2.0 | 1700 |
| 8 | $Cr_2O_3$ | 0.2 | $N_2$(760) | 1800 | 0.05 | 2.0 | 1700 |
| 9* | $TiO_2$ | 0.2 | $N_2$(760) | 2300 | 0.0002 | 1000 | 2100 |

(Note) The sample marked with * is a comparative sample.

TABLE 2

| Sample | Length × width (mm) | Thickness (μm) | Chemical composition (mol %) Al | Carbon | Metal other than Al | | Oxygen content (ppm) |
|---|---|---|---|---|---|---|---|
| 1 | 10 × 10 | 7100 | 92 | 8 | Ti | 0.06 | 460 |
| 2 | 10 × 10 | 320 | 92 | 8 | Ti | 0.01 | 120 |
| 3 | 10 × 10 | 8200 | 92 | 8 | Ti | 0.02 | 350 |
| 4 | 10 × 10 | 6400 | 92 | 8 | Ti | 0.1 | 410 |
| 5 | 10 × 10 | 5800 | 92 | 8 | Ti | 0.2 | 610 |
| 6 | 10 × 10 | 4300 | 92 | 8 | Zr | 0.03 | 230 |
| 7 | 10 × 10 | 9600 | 92 | 8 | V | 0.1 | 390 |
| 8 | 10 × 10 | 6100 | 90 | 8 | Cr | 2.0 | 470 |
| 9* | 4 × 4 | 1900 | 100 | 0 | Ti | 0.05 | 110 |

(Note) The sample marked with * is a comparative sample.

As is apparent from the above results, according to the process of the present invention, a high-purity single crystal of AlN could be synthesized at a temperature below the decomposition temperature (2,200° C.) of AlN as the source material in a very short holding time of 10 hr. Further, the AlN single crystal thus obtained had a size of not smaller than 10 mm square and a thickness of not less than 300 μm and, hence, was satisfactorily large as a bulk material.

On the other hand, as is apparent from the results on the comparative sample 9, heating at a temperature not lower than the decomposition temperature of AlN unfavorably resulted in the formation of a very small single crystal only. In the case of the sample 2 with the molar ratio of the oxide powder to the nitride powder being less than 0.01, the growth rate of the crystal was so low that the thickness was small. On the other hand, in the case of the sample 5 with the molar ratio exceeding 10, the oxygen content exceeded 500 ppm, resulting in lowered purity of the crystal. Further, for the sample 8, the use of the $Cr_2O_3$ powder as the oxide powder caused part of the powder to be vaporized during heating, resulting in increased Cr content of the crystal.

EXAMPLE 3

In the same manner as in Example 1, a source material powder was provided using the same AlN powder and $TiO_2$ powder as those used in Example 1 and the molar ratio of $TiO_2$ to AlN was the same as that in Example 1, i.e., 0.2, except that phenol as a carbon atmosphere source was not added. Further, the SiC single crystal plate, of which the material and the size were the same as those of the substrate used in Example 1, was provided as a substrate.

Figure 3:
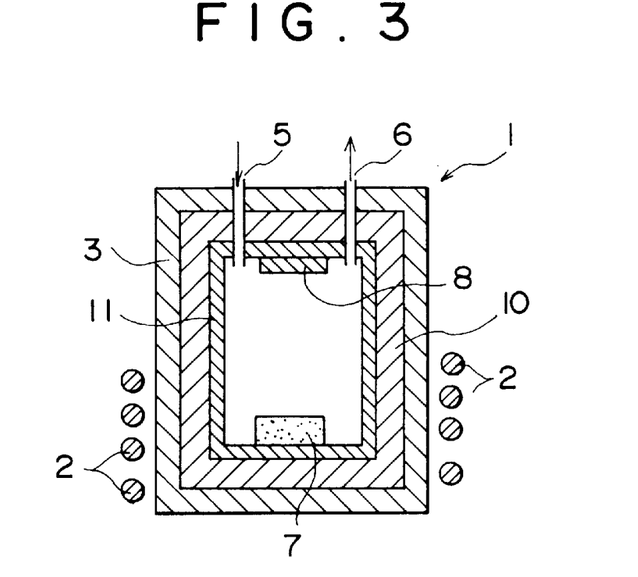
FIG. 3 is a schematic cross-sectional view showing a heating furnace used in Examples 3 and 4.

The construction of a heating furnace 1 used was as shown in FIG. 3 and fundamentally the same as that used in Example 2. In the furnace 1 used in this example, however, a vessel-like BN crucible 11 with a lid was placed on the inside of a graphite crucible 10, and an induction heating coil 2 was provided on only the lower half portion of the furnace 1. The source material 7 was placed within the vessel-like BN crucible 11 in the furnace 1, and an aluminum nitride single crystal was then synthesized in the same manner as in Example 1, except that the atmosphere gas introduced and the pressure of the gas was varied, for each sample, as shown in the following Table 3.

Conditions for growing a single crystal for each sample are summarized in Table 3, and the size and the composition of the resultant aluminum nitride single crystals are summarized in Table 4. The partial pressure Pr for each sample in Example 3 given in Table 3 is derived from the hydrogen gas introduced as the atmosphere gas.

TABLE 3

| Sample | Atmosphere gas | Gas pressure (Torr) | Heating temperature (° C.) | Partial pressure of $O_2$ (Torr) | Pr/Po Partial pressure ratio | Substrate temperature (° C.) |
|---|---|---|---|---|---|---|
| 10 | $N_2$ + 30% $H_2$ | 760 | 1800 | 0.0005 | 500000 | 1700 |
| 11* | Ar + 30% $H_2$ | 760 | 1800 | 0.0005 | 500000 | 1700 |
| 12 | $N_2$ + 2% $H_2$ | 760 | 1800 | 0.5 | 30 | 1700 |
| 13 | $N_2$ + 10% $H_2$ | 0.05 | 1800 | 0.01 | 0.5 | 1700 |
| 14 | $N_2$ + 90% $H_2$ | 10 | 1800 | 0.0002 | 50000 | 1700 |
| 15 | $N_2$ + 90% $H_2$ | 100 | 1800 | 0.0002 | 500000 | 1700 |
| 16 | $N_2$ + 90% $H_2$ | 760 | 1800 | 0.0002 | 3000000 | 1700 |

(Note) The sample marked with * is a comparative sample.

TABLE 4

| Sample | Length × width (mm) | Thickness (μm) | Chemical composition (mol %) Al | Hydrogen | Metal other than Al | | Oxygen content (ppm) |
|---|---|---|---|---|---|---|---|
| 10 | 10 × 10 | 8700 | 95 | 5 | Ti | 0.06 | 450 |
| 11* | Crystal not precipitated | — | — | — | — | — | — |
| 12 | 10 × 10 | 9800 | 97 | 3 | Ti | 0.06 | 650 |
| 13 | 10 × 10 | 9700 | 99 | 1 | Ti | 0.06 | 560 |
| 14 | 10 × 10 | 8800 | 95 | 5 | Ti | 0.06 | 470 |
| 15 | 10 × 10 | 7500 | 93 | 7 | Ti | 0.06 | 210 |
| 16 | 10 × 10 | 6800 | 85 | 15 | Ti | 0.06 | 130 |

(Note) The sample marked with * is a comparative sample.

As is apparent from the above results, use of a hydrogen-containing nitrogen atmosphere results in the formation of a high-purity, large-size AlN single crystal. On the other hand, the sample 11 using an atmosphere not containing nitrogen did not cause precipitation of any crystal. Further, in the case of both the sample 12 with the partial pressure of oxygen in the atmosphere exceeding 0.01 Torr and the sample 13 with the partial pressure ratio of Pr to Po being less than 1, the content of oxygen in the AlN single crystal unfavorably exceeded 500 ppm. On the other hand, in the case of the sample 16 with the partial pressure ratio of Pr to Po exceeding $10^6$, the content of Al in the crystal is less than 90 mol %.

EXAMPLE 4

69.6 g of the AlN powder used in Example 1 and 46.9 g of a $Ga_2O_3$ powder having a purity of 99% ($Ga_2O_3$:AlN molar ratio=0.15) were mixed together in ethanol, and the mixture was dried, and then compression-molded to prepare a source material powder. The same SiC single crystal plate as that used in Example 1 was provided as a substrate for growth of a crystal. The heating furnace used in this example was a heating furnace 1, as shown in FIG. 3, which was identical to that used in Example 3. The molded source material powder 7 was placed on the bottom of the BN crucible 11, and, as with Example 1, the substrate 8 was supported by a plate of an AlN sintered body and held above the source powder 7.

In this state, the interior of the heating furnace 1 was evacuated, and, while keeping the internal pressure of the heating furnace 1 at 10 Torr by introducing a gas mixture of 70% of nitrogen with 30% of hydrogen, the source material powder 7 was heated to 1,500° C., and the substrate 8 was heated to 1,100° C. In this state, the system was kept for 5 hr. At that time, the atmosphere gas around the substrate 8 was analyzed in the same manner as in Example 1. As a result, it was found that the partial pressure of oxygen was 0.005 Torr with the partial pressure ratio Pr/Po being 600.

The above procedure resulted in the formation of an AlGaN single crystal having a size of 10 mm in length×10 mm in width×710 μm in thickness on the substrate 8 constructed of an SiC single crystal plate. The total amount of Al and Ga was 95 mol % of the components excluding nitrogen in the crystal. The hydrogen content was 5 mol %, and the oxygen content was 150 ppm.

EXAMPLE 5

41.9 g of the GaN powder having a purity of 99% and 40.0 g of a $TiO_2$ powder used in Example 1 ($TiO_2$:GaN molar ratio=1:1) were mixed together in ethanol, and the mixture was dried and then compression-molded to prepare a source material powder. A single crystal plate of c-face-cut $Al_2O_3$ having a size of 10 mm square was provided as a substrate for growth of a crystal.

Figure 4:
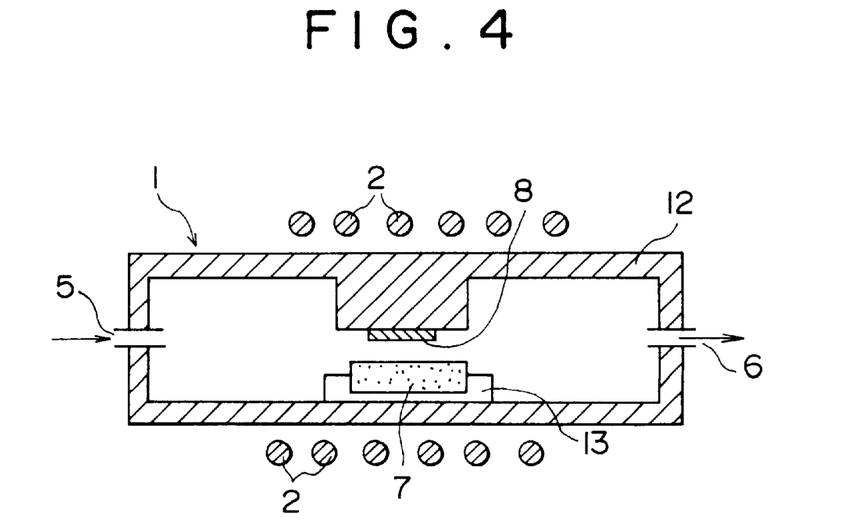
FIG. 4 is a schematic cross-sectional view showing a heating furnace, constructed of a quartz vessel, used in Example 5.

The heating furnace 1 used in this example was a cylindrical quartz vessel 12 shown in FIG. 4. It had, on its outer periphery, an induction heating coil 2, and an inlet 5 and outlet 6 for an atmosphere gas were provided on respective ends of the cylindrical quartz vessel 12. A graphite boat 13 was placed at the bottom on the inside of the cylindrical quartz vessel 12. The molded source material powder 7 was placed on the graphite boat 13, and, further, the substrate 8 was set above and so as to face the source material powder 7. The distance between the surface of the source material powder 7 and the substrate 8 was 5 mm.

In this state, the interior of the cylindrical quartz vessel 12 was evacuated, a gas mixture of 90% of nitrogen with 10% of hydrogen was introduced into the vessel to bring the internal total gas pressure to 760 Torr, the source material powder 7 was heated to a temperature below the decomposition temperature (1,100° C.) of GaN, i.e., 1,000° C., and the substrate 8 was heated to 900° C. In this state, the system was kept for 12 hr. At that time, the atmosphere gas around the substrate 8 was analyzed in the same manner as in Example 1. As a result, it was found that the partial pressure of oxygen was 0.0002 Torr with the partial pressure ratio Pr/Po being 300,000.

The above procedure resulted in the formation of a GaN single crystal having a size of 10 mm in length×10 mm in width×800 μm in thickness on the substrate 8 constructed of an Al$_2$O$_3$ single crystal plate. The amount of Ga was 95 mol % based on the total amount of the components excluding nitrogen in the crystal. The hydrogen content was 5 mol %, and the oxygen content was 100 ppm.

EXAMPLE 6

40.5 g of the same AlN powder as used in Example 1 and a B$_2$O$_3$ powder having a purity of 99% in a molar ratio to the AlN power specified in the following Table 5 were mixed together in ethanol, and the mixtures were dried and then compression-molded to prepare source material powders. The same SiC single crystal plate as that used in Example 1 was provided as a substrate for growth of a crystal. The heating furnace used in this example was a furnace shown in FIG. 2. Further, the source material powder 7 and the substrate 8 were placed as shown in FIG. 2.

In this state, the interior of the furnace 1 was evacuated, a nitrogen gas was introduced into the vessel to bring the internal total gas pressure to 760 Torr, the source material powder 7 was heated to a temperature below the decomposition temperature (2,200° C.) of AlN, i.e., 1,800° C., and the substrate 8 was heated to 1,700° C. In this state, the system was kept for 24 hr. At that time, the atmosphere gas around the substrate 8 was analyzed in the same manner as in Example 1. As a result, it was found that the partial pressure of oxygen was 0.008 Torr with the partial pressure ratio Pr/Po being 2.

For all the samples, the above procedure resulted in the formation of a BAlN single crystal having a size of 10 mm in length×10 mm in width on the substrate 8. The results of evaluation for each crystal are also summarized in Table 5. For all the crystals, the total amount of aluminum and boron was 96 mol % with respect to the total amount of the components excluding nitrogen (aluminum:boron molar ratio being shown in Table 5), and the content of metal components other than aluminum and boron was 0 mol %. The results given in Table 5 show that, in the case of a B$_k$Al$_l$N-based crystal wherein 0.47≦k≦0.53, a single crystal of Wurtzite type single phase is formed, whereas when k is outside the above range, a graphite type BN is included in the crystal. This is true of a B$_k$Ga$_m$N-based crystal and a B$_k$Al$_l$Ga$_m$-based crystal.

EXAMPLE 7

A powder of amorphous AlN having a purity of 99% was used as a source material powder to synthesize an AlN single crystal by sublimation. Specifically, as shown in FIG. 5, 20 g of the amorphous AlN powder as a source material powder 7 was placed in a vessel 14 of an AlN sintered body for growth of a single crystal, and the vessel 14 containing the source material powder 7 was then placed within a heating furnace 1.

Figure 5:
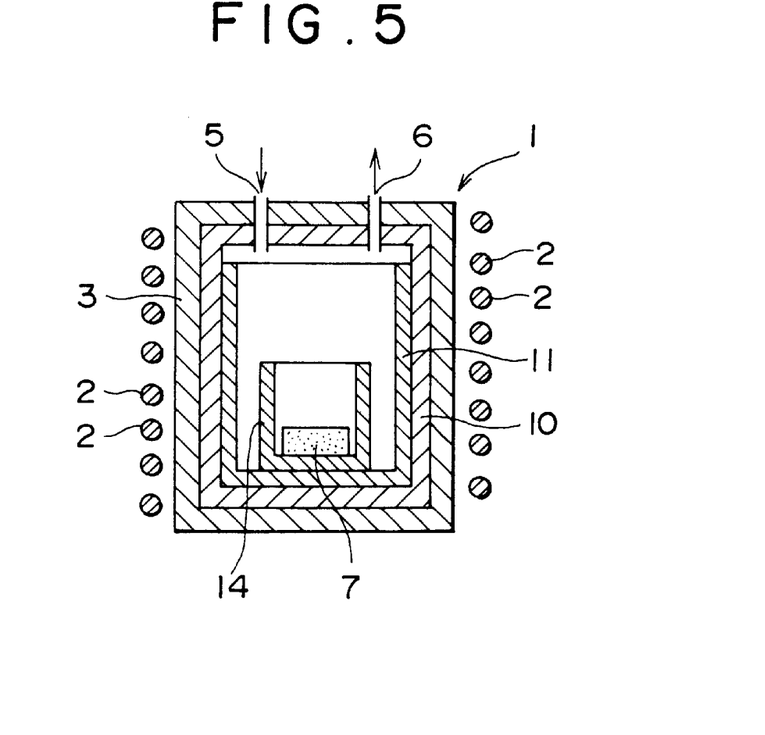
FIG. 5 is a schematic cross-sectional view showing a heating furnace used in Examples 7, 8, and 10.

The heating furnace 1 shown in FIG. 5 is fundamentally the same as that shown in FIG. 2. The heating furnace 1 is provided with an induction heating coil 2 and an insulator muffle 3, and a vessel-like graphite crucible 10 with a lid is provided within the heat insulator muffle 3. An inlet 5 and an outlet 6 for an atmosphere gas are provided at the top of the heating furnace 1. A BN crucible 11 without a lid was set within the graphite crucible 10 of the heating furnace, and the AlN vessel 14 containing the source material powder 7 of the amorphous AlN powder was placed within the BN crucible The interior of the heating furnace 1 was once evacuated. Thereafter, a nitrogen gas was introduced through the inlet 5 into the furnace to form a nitrogen atmosphere of 1 atm (760 Torr). Then, the AlN vessel 14 and the source material powder 7 contained in the AlN vessel 14 were heated to 1,850° C. by means of the induction heating coil 2, and, in this state, the system was held for 6 hr. In this case, components in the vapor phase within the AlN vessel 14 was then analyzed by spectroscopy. As a result, the partial pressure of oxygen was 0.0001 Torr with the ratio of the partial pressure of carbon (Pr) to the partial pressure of oxygen (Po), Pr/Po, being 10,000.

After the reaction for 6 hr, it was found that a rod-like, transparent, amber-colored mass having a size of 60 mm in length×2 mm in diameter was grown on the inner surface of the AlN vessel 14. The mass was then analyzed for the crystal structure by X ray diffractometry. As a result, it was confirmed that the crystal structure was in agreement with that of aluminum nitride and the crystal was a single crystal. Further, the composition of the crystal was analyzed. As a result, it was found that the aluminum content was 66% by weight, and the nitrogen content was 34% by weight, and the oxygen content was 200 ppm. The half value width of an X-ray diffraction peak was measured in the same manner as in Example 1 and found to be 40 sec.

For comparison, the synthesis of an AlN single crystal was attempted in the same manner as in Example 7, except that a crystalline powder of AlN was used as the source

TABLE 5

| Sample | Molar ratio of B$_2$O$_3$ (to AlN) | Crystal thickness (μm) | Crystal structure | Oxygen content (ppm) | Carbon (mol %) | Al:B (molar ratio) |
| --- | --- | --- | --- | --- | --- | --- |
| 17 | 1.4 | 9400 | Wurtzite type BAlN | 400 | 4 | 51:49 |
| 18 | 0.9 | 9200 | Wurtzite type AlN + graphite type BN | 390 | 4 | 54:46 |
| 19 | 1.8 | 9500 | Wurtzite type AlN + graphite type BN | 410 | 4 | 46:54 |

Although in all the above Examples the substrate for growth of a crystal used had a size of 10 mm square, use of a substrate having a size larger than 10 mm square enables the synthesis of a single crystal having a larger size.

material. However, no precipitate could be found anywhere within the heating furnace.

EXAMPLE 8

29.96 g of a TiO$_2$ powder having a purity of 99% was added to 20.5 g of the same amorphous AlN powder as used in Example 7, followed by ultrasonic mixing in isopropanol. The mixture was then dried to remove isopropanol, thereby preparing a source material powder. In the same manner as in Example 7, the source material powder was placed in vessel 14 made of an AlN sintered body as shown in FIG. 5, and the vessel 14 containing the source material powder 7 was then placed in a BN crucible 11 of the heating furnace 1.

The interior of the heating furnace 1 was once evacuated. Thereafter, a nitrogen gas was introduced into the furnace to form a nitrogen atmosphere of 1 atm. The AlN vessel 14 was then heated to 1,900° C., and in this state, the system was held for 6 hr. In this case, the partial pressure of oxygen within the AlN vessel 14 was 0.01 Torr with the ratio of the partial pressure of carbon (Pr) to the partial pressure of oxygen (Po), Pr/Po, being 10.

After the reaction for 6 hr, it was found that a rod-like mass having a size of 100 mm in length×4 mm in diameter was grown on the inner surface of the AlN vessel 14. The crystal was then analyzed in the same manner as in Example 7. As a result, it was confirmed that the crystal was an aluminum nitride single crystal, the oxygen content was 450 ppm and the half value width of an X-ray diffraction peak was 56 sec.

An AlN single crystal was synthesized in the same manner as in Example 8, except that a crystalline powder of AlN was used instead of the amorphous AlN powder. As a result, an AlN single crystal mass having a size of 20 mm in length×0.8 mm in diameter was precipitated on the inner surface of the AlN vessel.

EXAMPLE 9

25 g of the same amorphous AlN powder as used in Example 7 was provided as a source material powder, and a sapphire (0001) face substrate was provided as a substrate. A heating furnace 1 as shown in FIG. 2 was provided, and a BN crucible 11 without a lid was disposed within a graphite crucible 10 in the furnace, and the source material powder 7 of the amorphous AlN powder was directly placed within the BN crucible 11. The substrate 8 was then provided on the inner surface of the lid of the graphite crucible 10 while leaving a distance of 20 mm from the source material powder 7.

Thereafter, the interior of the heating furnace 1 was once evacuated. A nitrogen gas was then introduced into the furnace to form a nitrogen atmosphere of 1 atm. The BN crucible 11 was then heated to 1,800° C., and in this state, the system was held for 6 hr. In this case, the partial pressure of oxygen within the BN crucible 11 was 0.0001 Torr with the ratio of the partial pressure of carbon (Pr) to the partial pressure of oxygen (Po), Pr/Po, being 10.

After the reaction for 6 hr, it was found that an AlN single crystal having a thickness of 400 μm was grown on the whole face of the substrate 8, composed of a single crystal of sapphire, having a size of 10×10 mm. The oxygen content of the AlN single crystal was 480 ppm, and the half value width of an X-ray diffraction peak was 76 sec.

For comparison, a single crystal was synthesized in the same manner as in Example 9, except that the temperature of the BN crucible 11 was 1,800° C. As a result, after the holding for 6 hr, it was found that the sapphire substrate had an attacked and roughened surface and no large and sound single crystal was obtained.

EXAMPLE 10

35.07 g of a powder of amorphous $Si_3N_4$ having a purity of 99% and 14.98 g of a powder of $TiO_2$ having a purity of 99% were mixed together in ethanol by ultrasonic mixing, and the mixture was dried to remove ethanol, thereby preparing a source material powder. This source material powder was placed, as shown in FIG. 5, in a vessel 14 made of an AlN sintered body disposed within a BN crucible 11 without a lid in a heating furnace 1.

Thereafter, the interior of the heating furnace 1 was once evacuated. A nitrogen gas was then introduced into the furnace to form a nitrogen atmosphere of 1 atm. The interior of the BN crucible 11 was then heated to 1,550° C., and in this state, the system was held for 6 hr. In this case, components in the vapor phase within the BN crucible 11 were analyzed by spectroscopy. As a result, the partial pressure of oxygen was 0.005 Torr with the ratio of the partial pressure of carbon (Pr) to the partial pressure of oxygen (Po), Pr/Po, being 5.

After the reaction for 6 hr, it was found that a ribbon-like silicon nitride single crystal having a size of 30 mm in length×0.1 mm in width×10 μm in thickness was provided in the AlN vessel 14. The $Si_3N_4$ single crystal had an oxygen content of 490 ppm and, regarding an X-ray diffraction peak thereof, a half value width of 85 sec.

For comparison, the preparation of an $Si_3N_4$ single crystal was attempted in the same manner as in Example 10, except that a crystalline powder of $Si_3N_4$ alone was used as the source material. However, any precipitate could not be formed at all.

EXAMPLE 11

A source material powder composed of the same amorphous $Si_3N_4$ powder and $TiO_2$ powder as used in Example 10 was provided and, as shown in FIG. 2, placed within a BN crucible 11 without a lid in a heating furnace 1. Further, a silicon carbide (0001) face substrate 8 was then provided and set above the source material powder 7 while leaving a distance of 20 mm from the source material powder 7.

Thereafter, the interior of the heating furnace 1 was once evacuated. A nitrogen gas was then introduced into the furnace to form a nitrogen atmosphere of 1 atm. The BN crucible 11 was then heated to 1,550° C., and in this state, the system was held for 6 hr. In this case, components in the vapor phase within the BN crucible 11 were then analyzed by spectroscopy. As a result, the partial pressure of oxygen was 0.005 Torr with the ratio of the partial pressure of carbon (Pr) to the partial pressure of oxygen (Po), Pr/Po, being 5.

After the reaction for 6 hr, it was found that a 350 μm-thick single crystal film of silicon nitride was grown on the whole face of the substrate 8, constructed of an SiC single crystal, having a size of 10×10 mm. The single crystal film had an oxygen content of 470 ppm and, regarding an X-ray diffraction peak thereof, a half value width of 90 sec.

For comparison, a single crystal was synthesized in the same manner as in Example 11, except that the temperature of the heating furnace was 1,800° C. After the holding for 6 hr, it was found that the substrate composed of the SiC single crystal completely disappeared due to sublimation.

EXAMPLE 12

In the same manner as in Example 2, an aluminum nitride single crystal was synthesized using an AlN powder having a purity of 99%, a $TiO_2$ powder having a purity of 99%, and a heating furnace 1 as shown in FIG. 2, except that the molar ratio of the $TiO_2$ powder to the AlN powder ($TiO_2$/AlN) or the heating temperature was varied as specified in Table 6.

Crystal growth conditions for each sample are summarized in Table 6, and the size, the chemical composition, and properties of each of the resultant aluminum nitride single crystals are summarized in Table 7.

EXAMPLE 13

An aluminum nitride single crystal was synthesized under crystal growth conditions specified in the following Table 8

TABLE 6

| Sample | Oxide | Molar ratio (to AlN) | Atmosphere (Torr) | Heating temperature (° C.) | Partial pressure of $O_2$ (Torr) | Pr/Po Partial pressure ratio | Substrate temperature (° C.) |
| --- | --- | --- | --- | --- | --- | --- | --- |
| 20 | $TiO_2$ | 0.2 | $N_2$(760) | 1900 | 0.005 | 2.0 | 1700 |
| 21 | $TiO_2$ | 0.2 | $N_2$(760) | 1950 | 0.005 | 2.0 | 1700 |
| 22 | $TiO_2$ | 0.2 | $N_2$(760) | 2000 | 0.005 | 2.0 | 1700 |
| 23 | $TiO_2$ | 0.001 | $N_2$(760) | 1900 | 0.001 | 10.0 | 1700 |
| 24 | $TiO_2$ | 10.0 | $N_2$(760) | 1900 | 0.01 | 1.0 | 1700 |

TABLE 7

| Sample | Length × width (mm) | Thickness (μm) | Chemical composition (mol %) | | | | Oxygen content (ppm) | Rocking curve (min) | Thermal conductivity (W/mK) |
| --- | --- | --- | --- | --- | --- | --- | --- | --- | --- |
| | | | Al | Carbon | Metal other than Al | | | | |
| 20 | 10 × 10 | 8400 | 92 | 8 | Ti | 0.06 | 460 | 0.9 | 310 |
| 21 | 10 × 10 | 9300 | 92 | 8 | Ti | 0.06 | 460 | 4.7 | 280 |
| 22 | 10 × 10 | 10100 | 92 | 8 | Ti | 0.06 | 460 | 5.2 | 200 |
| 23 | 10 × 10 | 310 | 92 | 8 | Ti | 8 ppb | 250 | 5.1 | 220 |
| 24 | 10 × 10 | 6100 | 92 | 8 | Ti | 0.15 | 649 | 5.5 | 190 |

As is apparent from the above results, when the half value width of a rocking curve obtained by X-ray diffractometry was more than 5 min, the thermal conductivity was likely to be lowered. The half value width is preferably not more than 5 min from the viewpoint of offering stable properties. The tendency toward lowering in thermal conductivity was observed also in the case of a content of titanium, a transition metal, of less than 10 ppb or more than 0.1 mol %, indicating that the content of the transition metal is preferably in the range of from 10 ppb to 0.1% by mole from the viewpoint of offering stable properties.

in the same manner as in Example 2, except that a powder of amorphous aluminum nitride having a purity of 99% was used as the source material powder and mixing of an oxide powder was not conducted. For comparison, a single crystal was synthesized in the same manner as described just above, except that a crystalline powder of aluminum nitride having a purity of 99% alone was used without using any oxide powder. The size and the chemical composition of each of the resultant aluminum nitrides are summarized in Table 9.

TABLE 8

| Sample | Source material powder | Atmosphere (Torr) | Heating temperature (° C.) | Partial pressure of $O_2$ (Torr) | Pr/Po Partial pressure ratio | Substrate temperature (° C.) |
| --- | --- | --- | --- | --- | --- | --- |
| 25 | Amorphous AlN | $N_2$(760) | 1850 | 0.0005 | 500000 | 1700 |
| 26* | Crystalline AlN | $N_2$(760) | 1850 | 0.0002 | 500000 | 1700 |

(Note) The sample marked with * is a comparative sample.

TABLE 9

| Sample | Length × width (mm) | Thickness (μm) | Chemical composition (mol %) | | | Oxygen content (ppm) |
| --- | --- | --- | --- | --- | --- | --- |
| | | | Al | Carbon | Metal other than Al | |
| 25 | 10 × 10 | 450 | 98 | 2 | Free | 460 |
| 26* | | | Cyrstal not precipitated | | | |

(Note) The sample marked with * is a comparative sample.

As is apparent from the above results, the use of a powder of an amorphous nitride as the source material powder enabled the preparation of a single crystal of a nitride at a temperature below that in the case where a powder of a crystalline nitride was used.

EXAMPLE 14

2.1 g of a $TiO_2$ powder having a purity of 99% was added to 20 g of an amorphous silicon nitride powder having a purity of 99% ($TiO_2:Si_3N_4$ molar ratio=0.1), followed by ultrasonic mixing in ethanol. The mixture was then dried to remove ethanol, thereby preparing a mixed powder which was then compression-molded to obtain a source material powder. Separately, a c-face-cut, 6H type SiC single crystal plate having a size of 10 mm square was provided as a substrate for crystal growth.

Figure 6:
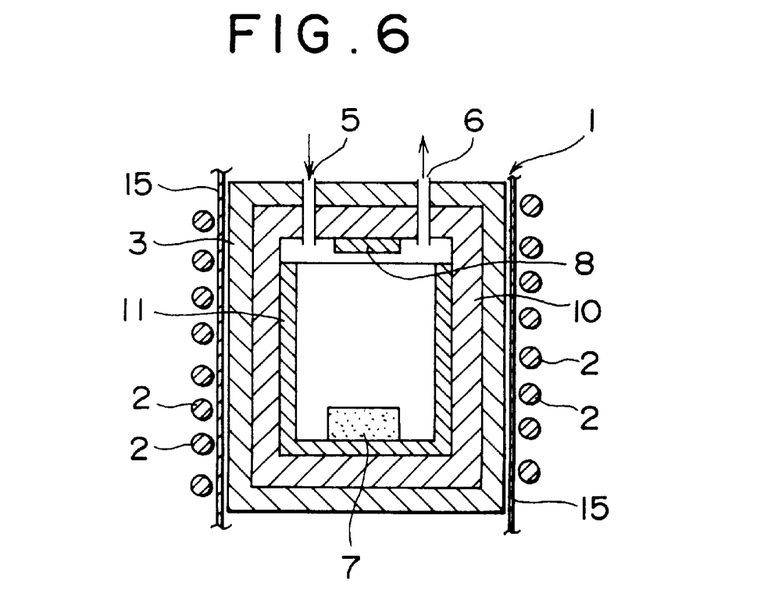
FIG. 6 is a schematic cross-sectional view showing a heating furnace used in Example 14.

The source material powder and the substrate were placed in a heating furnace 1 as shown in FIG. 6. Specifically, the heating furnace 1 has a vacuum ceramic vessel 15 provided on the inside of an induction heating coil 2. An insulator muffle 3 is provided within the vacuum vessel 15. A graphite crucible 10 with a lid is disposed on the inside of the insulator muffle 3, and a BN crucible 11 without a lid is disposed on the inside of the graphite crucible 10. The source material powder 7 was placed in the BN crucible 11, and the substrate 8 was disposed above and so as to face the source material powder 7.

Thereafter, the interior of the heating furnace 1 was once evacuated. A nitrogen gas was then introduced into the furnace through an inlet 5 to bring the pressure within the furnace to 1 atm (760 Torr). The outer surface of the source material powder 7 in the graphite crucible 10 was then heated to 1,600° C. (decomposition temperature of $Si_3N_4$: 1,750° C.) by heating, while the outer surface of the substrate 8 was heated to 1,500° C. by regulating the heating section. In this state, the system was held for 24 hr. In this case, components in the vapor phase within the graphite crucible 10 were analyzed by spectroscopy. As a result, the partial pressure of oxygen was 0.005 Torr with the ratio of the partial pressure of carbon (Pr) to the partial pressure of oxygen (Po), Pr/Po, being 50,000.

After the reaction for 24 hr, it was found that a transparent mass having the size of 10 mm square and a thickness of 450 µm was grown on the lower surface of the substrate 8, constructed of an SiC single crystal, having a size of 10 mm square. The mass was then analyzed by X ray diffractometry. As a result, it was confirmed that the crystal was a silicon nitride single crystal. Further, the composition of the crystal was analyzed. As a result, it was found that 98 mol % of a total amount of the components excluding nitrogen was accounted for by silicon, the oxygen content was 180 ppm, the carbon content was 2 mol %, and the titanium content was 0.02 mol %.

According to the present invention, a single crystal of a nitride as a bulk having a low content of impurity, such as oxygen, high quality, and a very large size can be synthesized in a short time by a simple process utilizing sublimation. Therefore, the present invention can provide a single crystal of a nitride, useful as heat sinks, electric and electronic components, such as semiconductors, optical components, and components of electric equipment and office automation equipment, as a large bulk material at a low cost.

What is claimed is:

1. A single crystal of a nitride having a length of not less than 10 mm, a width of not less than 10 mm and a thickness of not less than 300 µm, or having a length of not less than 20 mm and a diameter of not less than 10 µm.

2. The single crystal of a nitride according to claim 1, wherein the half value width of a rocking curve obtained by X-ray diffractometry is not more than 5 min.

3. The single crystal of a nitride according to claim 1, which has a transition metal content of 10 ppb to 0.1% by mole.

4. The single crystal of a nitride according to claim 3, wherein the transition metal is titanium.

5. The single crystal of a nitride according to claim 1, wherein not less than 90% by mole of a total content of the components other than nitrogen is accounted for by a group 3B element.

6. The single crystal of a nitride according to claim 5, wherein the group 3B element is at least one member selected from the group consisting of aluminum, gallium, and indium.

7. The single crystal of a nitride according to claim 1, which is composed mainly of a member selected from the group consisting of $B_kAl_lN$, $B_kGa_mN$ and $B_kAl_lGa_mN$, wherein $0.47 \leq k \leq 0.53$ and $0.47 \leq l+m \leq 0.53$, and has a Wurtzite type crystal structure.

8. The single crystal of a nitride according to claim 1, wherein not less than 90% by mole of a total content of the components other than nitrogen is accounted for by silicon.

9. The single crystal of a nitride according to claim 1, which has an oxygen content of not more than 500 ppm.

10. A process for preparing a single crystal of a nitride, comprising the steps of: mixing a nitride powder with an oxide powder which is reactive with the nitride under heating to decompose and vaporize the nitride; heating the mixed powder in a nitrogen atmosphere or in a nitrogen atmosphere containing hydrogen and/or carbon at a temperature below the sublimation temperature or melting temperature of the nitride to decompose and vaporize the nitride powder; and allowing a crystal of the decomposed and vaporized component to grow from a vapor phase on a substrate.

11. The process according to claim 10, wherein the nitride powder is an amorphous nitride powder.

12. The process according to claim 10, wherein 0.01 to 10 moles of the oxide powder is mixed based on 1 mole of the nitride powder.

13. The process according to claim 10, wherein the oxide powder comprises an oxide of a transition metal element not vaporizable at the heating temperature.

14. The process according to claim 13, wherein the oxide powder comprises an oxide of a group 4A or 5A element.

15. The process according to claim 14, wherein the oxide powder comprises titanium oxide.

16. The process according to claim 10, wherein the oxide powder comprises an oxide of a group 3B element.

17. A process for preparing a single crystal of a nitride, comprising the steps of: heating a powder of a nitride comprising an amorphous nitride in a nitrogen atmosphere or in a nitrogen atmosphere containing hydrogen and/or carbon to decompose and vaporize the nitride powder; and allowing a crystal of the decomposed, vaporized component to grow from a vapor phase on a substrate.

18. The process according to claim 10, wherein the substrate, on which the crystal is allowed to grow, is formed of sapphire, silicon carbide, or aluminum nitride.

19. The process according to claim 17, wherein the substrate, on which the crystal is allowed to grow, is formed of sapphire, silicon carbide, or aluminum nitride.

20. The process according to claim 10, wherein the partial pressure of oxygen in the atmosphere around the substrate is not more than $10^{-2}$ Torr.

21. The process according to claim 17, wherein the partial pressure of oxygen in the atmosphere around the substrate is not more than $10^{-2}$ Torr.

22. The process according to claim 10, wherein the ratio of the partial pressure Pr of hydrogen and carbon to the partial pressure Po of oxygen and an oxide other than hydrogen and carbon, Pr/Po, in the atmosphere around the substrate is 1 to $10^6$.

23. The process according to claim 17, wherein the ratio of the partial pressure Pr of hydrogen and carbon to the partial pressure Po of oxygen and an oxide other than hydrogen and carbon, Pr/Po, in the atmosphere around the substrate is 1 to $10^6$.

\* \* \* \* \*